(12) United States Patent
Relph

(10) Patent No.: US 6,218,880 B1
(45) Date of Patent: *Apr. 17, 2001

(54) ANALOG DELAY LINE IMPLEMENTED WITH A DIGITAL DELAY LINE TECHNIQUE

(75) Inventor: Richard Relph, Clara, CA (US)

(73) Assignee: Legerity, Austin, TX (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/993,519

(22) Filed: Dec. 18, 1997

(51) Int. Cl.[7] .................................................. H03H 11/26
(52) U.S. Cl. .......................... 327/277; 327/271; 327/284
(58) Field of Search ..................................... 327/277, 271, 327/270, 261, 276, 284, 161, 269; 348/638, 640

(56) References Cited

U.S. PATENT DOCUMENTS

| | | | | |
|---|---|---|---|---|
| 3,827,288 | * | 8/1974 | Fletcher | 73/69 |
| 4,553,156 | * | 11/1985 | Douziech | 348/638 |
| 5,132,572 | | 7/1992 | Woo | 326/73 |
| 5,189,420 | * | 2/1993 | Eddy | 341/157 |
| 5,220,216 | | 6/1993 | Woo | 326/50 |
| 5,227,679 | | 7/1993 | Woo | 326/50 |
| 5,241,604 | * | 8/1993 | Noguchi | 381/63 |
| 5,264,745 | | 11/1993 | Woo | 326/62 |
| 5,349,612 | | 9/1994 | Guo et al. | 375/371 |
| 5,355,037 | * | 10/1994 | Andresen et al. | 327/158 |
| 5,363,419 | | 11/1994 | Ho | 375/376 |
| 5,367,542 | | 11/1994 | Guo | 375/359 |
| 5,400,370 | | 3/1995 | Guo | 375/371 |
| 5,428,309 | * | 6/1995 | Yamauchi | 327/158 |
| 5,452,333 | | 9/1995 | Guo et al. | 375/371 |
| 5,457,336 | | 10/1995 | Fang et al. | 257/322 |
| 5,457,719 | | 10/1995 | Guo et al. | 375/373 |
| 5,473,638 | * | 12/1995 | Marchetto | 375/356 |
| 6,046,620 | * | 4/2000 | Relph | 327/277 |

* cited by examiner

Primary Examiner—Timothy P. Callahan
Assistant Examiner—Minh Nguyen
(74) Attorney, Agent, or Firm—McDermott, Will & Emery

(57) ABSTRACT

An analog delay line uses an analog-to-digital (A/D) converter which converts an analog signal into a plurality of digital signals. Digital delay lines, each including a series of digital delay elements, delay the respective digital signals. A digital-to-analog (D/A) converter converts the digital signals back into a delayed analog signal.

13 Claims, 2 Drawing Sheets

ANALOG DELAY LINE IMPLEMENTED WITH A DIGITAL DELAY LINE TECHNIQUE

TECHNICAL FIELD

The present invention relates to signal processing and, more particularly, to a circuit and methodology for delaying an analog signal.

BACKGROUND ART

There are many situations in which it is desirable to delay an analog electrical signal for a prespecified period of time. For example, delaying analog signals is common in processing audio signals, such as music. Conventional techniques of delaying analog signals, however, have a number of drawbacks.

Some conventional analog delay lines involve large-lumped components, such as large capacitors, resistors, and inductors, that are difficult to manufacture on a monolithic semiconductor substrate. Moreover, some conventional analog delay lines may not be able to accurately achieve small delay periods, e.g. around 1 ns. A related difficulty with conventional analog delay lines is in obtaining fine resolution within the delay periods, for example, about 200 ps.

DISCLOSURE OF THE INVENTION

There exists a need for an analog delay line that can readily be implemented on a monolithic semiconductor substrate. There is also a need for an analog delay line which can accurately achieve small delay periods and fine resolution within the delay periods.

These and other needs are met by the present invention, in which an analog-to-digital (A/D) converter converts an analog signal into a plurality of digital signals. The digital signals are delayed by digital delay lines and reconverted into a delayed analog signal. By converting the analog signal into a digital signal, the analog delay line can delay the analog signal by digital delay techniques, and the analog delay line can readily be implemented on a monolithic semiconductor substrate and achieve small delay periods with fine resolution.

According to one aspect of the invention, an analog delay line comprises an analog-to-digital converter, having an analog signal input and a plurality of digital signal outputs. A plurality of digital delay lines are coupled respectively to the digital signal outputs, in which each digital delay line includes a plurality of digital delay elements coupled in series. A digital-to-analog converter, having an analog signal output, has a plurality of digital signal inputs coupled respectively to outputs of the digital delay lines. Preferably, the digital delay lines and digital delay elements include an input for receiving a calibration signal for adjusting the delay period, for example, to be about 140 ps.

According to another aspect of the invention, a method of delaying an analog signal includes the step of converting the analog signal into a plurality of digital signals. The method includes repeatedly delaying by a common delay period the plurality of digital signals and converting the plurality of repeatedly delayed digital signals into a delay analog signal. The method may include the step of calibrating the common delay period to be about 140 ps.

Additional objects, advantages, and novel features of the present invention will be set forth in part in the detailed description which follows, and in part will become apparent upon examination or may be learned by practice of the invention. The objects and advantages of the invention may be realized and obtained by means of the instrumentalities and combinations particularly pointed out in the appended claims.

BRIEF DESCRIPTION OF DRAWINGS

The present invention is illustrated by way of example, and not by limitation, in the figures of the accompanying drawings, wherein elements having the same reference numeral designations represent like elements throughout and wherein.

BEST MODE FOR CARRYING OUT THE INVENTION

A circuit and method for delaying an analog signal, are described. In the following description, for purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

HIGH-SPEED DIGITAL DELAY LINE

Figure 1A:
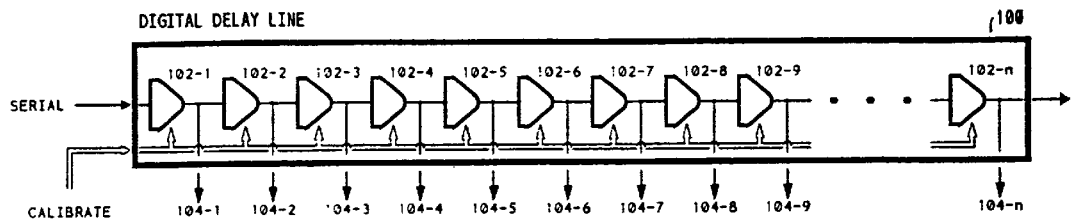
FIG. 1(a) is a block diagram of a digital delay line with which the present invention can be implemented.

FIG. 1 is a block diagram of an exemplary high-speed, digital delay line 100 with which the present invention can be implemented. The exemplary high-speed digital delay line 100 receives a serial bit stream comprising a plurality of bits spaced at regular intervals, termed "bit stream clock periods." Digital delay line 100 delays the serial bit stream so that an identical serial bit stream is output but with a phase delay of an integral number of bit stream clock periods.

Specifically, digital delay line 100 comprises a plurality of digital delay elements 102-1 to 102-n, coupled in series. Each of the digital delay elements 102-1 to 102-n delays a digital signal for a specified amount of time. Digital delay line 100 may comprise an arbitrary number n of digital delay elements, depending upon any constraints inherent in the semiconductor implementation utilized or other practical considerations. For example, digital delay line 100 can comprise tens of thousands of digital delay elements. Since each of the digital delay elements 102-1 to 102-n of digital delay line 100 is constructed during the same manufacturing process on the same semiconductor substrate, it is likely that the operating characteristics, and hence the delay period, of each digital delay element are nearly identical.

When the common delay period equals the bit stream clock period, each individual bit of the serial bit stream input into digital delay line 100 is delayed by a respective digital delay element. Thus, outputs of a plurality of digital delay elements may be tapped to simultaneously monitor a plurality of bits of the serial bit stream. Accordingly, digital delay line 100 comprises a plurality of taps 104-1 to 104-n coupled to the outputs of the respective digital delay elements 102-1 to 102-n for monitoring portions of the serial bit stream in parallel.

Delay characteristics of any digital circuit will vary from chip to chip and over time because of unavoidable variations in manufacturing and operating conditions. Thus, there is a need to calibrate the delay period of each of the digital delay elements 102-1 to 102-n to match the bit stream clock period. According to one approach, both the delay period and the bit stream clock period are synchronized to a reliable, precise reference clock, such as a crystal oscillator.

The delay period of each of the digital delay elements 102-1 to 102-n is preferably adjustable by a digital command code as a calibration signal. This calibration signal is produced with reference to a reliable, precise clock signal, preferably by an on-chip digital servo circuit (not shown) such as described in the commonly assigned U.S. Pat. No. 5,457,719, issued to Guo et al. on Oct. 10, 1995. Briefly, the on-chip digital servo circuit comprises an adjustable digital delay line of its own, which it monitors and continually adjusts with a calibration signal in a feedback loop. The calibration signal is shared with other systems on the chip.

Figure 1B:
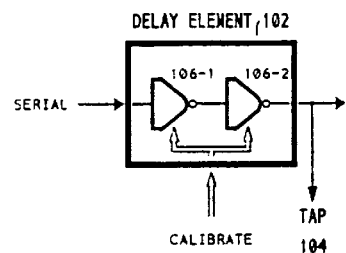
FIG. 1(b) is a block diagram of an adjustable delay element of a digital delay line.

Referring to FIG. 1(b), each adjustable digital delay element 102 comprises two adjustable inverters 106-1 and 106-2, coupled in series, each receiving the aforementioned calibration signal. Thus, the delay period of each of the two adjustable inverters 106-1 and 106-2 is one-half of the bit stream clock period and is controlled by the calibration signal.

Figure 1C:
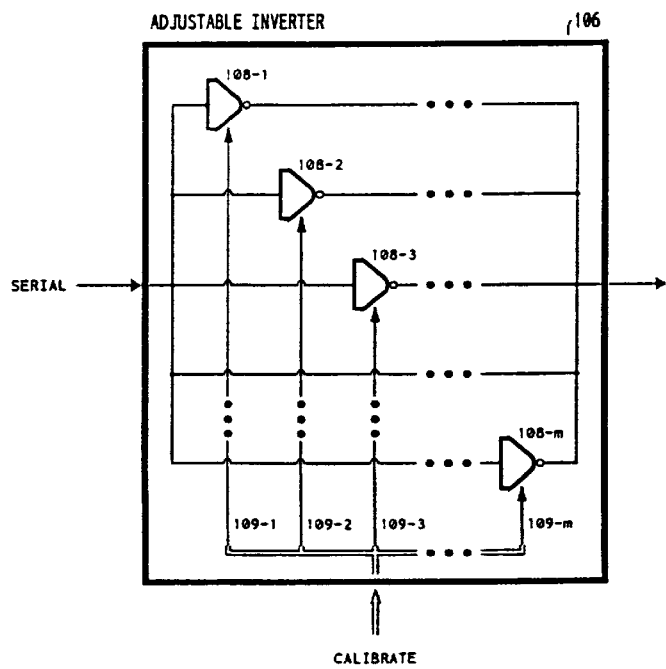
FIG. 1(c) is a block diagram of an adjustable inverter of an adjustable delay element.

Referring to FIG. 1(c), each adjustable inverter 106 in a preferred embodiment comprises a plurality of switchable inverters 108-1 to 108-m coupled in parallel. Each of the switchable inverters 108-1 to 108-m is switched on or off by one of bits 109-1 to 109-m of the calibration signal. Thus, two of the parameters that determine the propagation delay of an inverter, the P-channel size to N-channel size ratio and the driving power, may be determined for precise control over the delay period. Switchable inverters are described in further detail in the commonly assigned U.S. Pat. No. 5,220,216, issued to Woo on Jun. 15, 1993, and the commonly assigned U.S. Pat. No. 5,227,679, issued to Woo on Jul. 13, 1993.

Accordingly, digital delay line 100 comprises a series of adjustable digital delay elements 102-1 to 102-n, each of which provides a uniform delay period synchronized to a reference clock period according to a calibration signal. Moreover, each adjustable inverter 106 can have a consistent delay period of as little as 70 ps. Thus, each adjustable digital delay element 102 can have a consistent delay period of as little of 140 ps. Therefore, digital delay line 100 is high-speed, capable of processing a serial bit stream at data rates up to about 7 GHz. Furthermore, digital delay line 100 provides parallel taps 104-1 to 104-n for simultaneously viewing in parallel any portion of a high-speed serial bit stream.

ANALOG DELAY LINE

Figure 2:
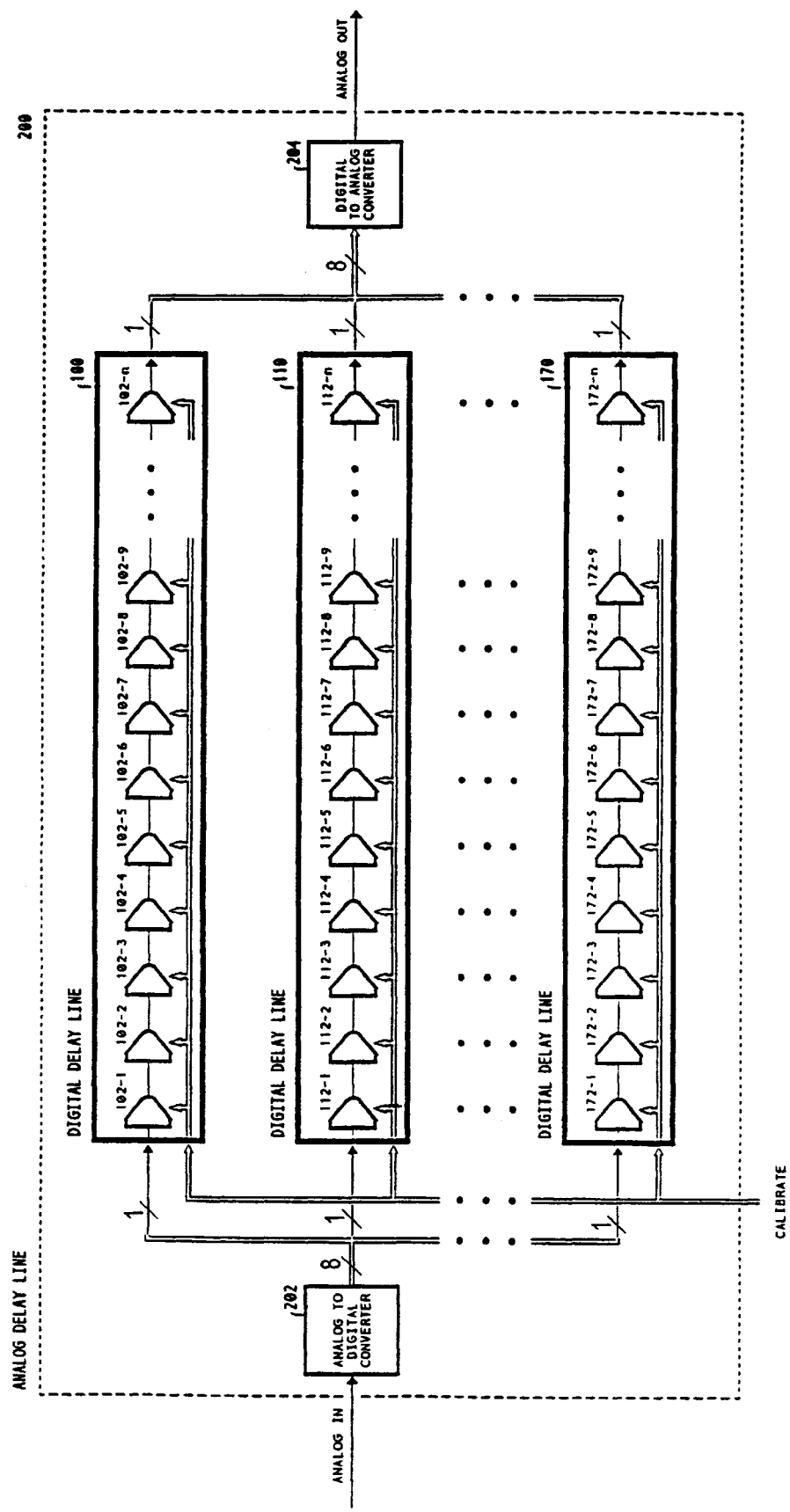
FIG. 2 is a diagram of an analog delay line according to one embodiment.

Referring to FIG. 2, depicted is an analog delay line 200 according to one embodiment of the invention. Analog delay line 200 receives an analog signal through an "analog in" input, delays the analog signal, and outputs the delayed signal through an "analog out" output.

The analog signal received through the "analog in" input is converted into digital form in bit-parallel format, that is 'N' bits wide, by analog-to-digital (A/D) converter 202. The present invention may be implemented with a variety of A/D converters known in the art, but does not require any specific A/D converter. Preferably a fast A/D converter, such as a flash A/D converter, may be employed.

The 'N' bits of the digital signal are fed into 'N' digital delay lines 100 to 170. Although FIG. 2 depicts an analog delay line 200 with eight digital delay lines 100 to 170 (for an eight-bit output of A/D converter 202), the present invention may be implemented with any number of digital delay lines for each bit of output from A/D converter 202. Generally, more bits of digital output from A/D converter 202 allow delay of analog signals with greater range and precision. Preferably, at least eight bits of digital output is desirable, even up to 32 and 64 bits. The number of digital delay lines matches the number of output bits from A/D converter 202 in order to use pre-existing designs for A/D converter 202. For example, typical A/D converters output 8 bits, 9 bits, 10 bits, 12 bits, and 16 bits of data. Thus, the number of digital delay lines for such A/D converters would be 8, 9, 10, 12, and 16, respectively.

The digital delay lines 100 to 170 are implemented with enough adjustable digital delay elements of a particular delays period so that the total delay period is the desired period for the analog delay line 200, taking into account the delays of the A/D converter 202 and D/A converter 204. For example, if the desired delay period is 30 ns in excess of the digital conversion periods, then a minimum of 215 (30 ns/140 ps=214.3 rounded up) adjustable delay elements 102 having a 140 ps delay period is required. The resolution of the total delay period would be delay period of a single digital delay element, i.e. 140 ps.

The number of adjustable, delay elements 102 can be reduced by using adjustable delay elements 102 with a larger period. In fact, adjustable delay elements 102 having different periods may be used, for example twenty with a delay period of 1.4 ns and fifteen with a delay period of 140 ps.

The digital delay lines 100 to 170 delay each bit of the digital form of the analog signal for the desired period of time and pass the digital signals to digital-to-analog (D/A) converter 204. D/A converters are well known in the art, and a variety of D/A converters may each be employed to practice the invention. Preferably, D/A converters with short delay times are used.

D/A converter 204 reconverts the digital signals into an analog signal, which is a delayed form of the input analog signal. The delayed analog signal is output from the D/A converter 204, and hence the analog delay line 200.

Use of digital delay lines comprising a series of calibratable digital delay elements allows smaller delay periods to be accurately achieved. Furthermore, since each digital delay element can consistently have a delay period as short as 140 ps, the resolution of the analog delay period can be within 200 ps. Since the delay lines are all-digital, the delay lines can be fabricated on a monolithic semiconductor substrate.

While this invention has been described in connection with what is presently considered to be the most practical and preferred embodiment, it is to be understood that the invention is not limited to the disclosed embodiments, but, on the contrary, is intended to cover various modifications and equivalent arrangements included within the spirit and scope of the appended claims.

What is claimed is:

1. An analog delay line comprising:
    an analog-to-digital converter, having an analog signal input and a plurality of digital signal outputs of bit parallel format;
    a plurality of digital delay lines coupled respectively to the digital signal outputs; and
    a digital-to-analog converter, having an analog signal output and a plurality of digital signal inputs coupled respectively to outputs of the digital delay lines; wherein:

each of the digital delay lines includes a plurality of digital delay elements coupled in series;

each of the digital delay elements includes an adjustable inverter responsive to a calibration signal having a plurality of bits for adjusting the delay period thereof; and each said adjustable inverter includes a plurality of switchable inverters coupled in parallel that are switched on or off in response to respective said bits of the digital calibration signal.

2. The analog delay line of claim 1, wherein the number of the plurality of digital signal outputs is at least eight.

3. The analog delay line of claim 2, wherein the number of the plurality of digital signal outputs is one of eight, nine, ten, twelve, sixteen, thirty-two, and sixty-four.

4. The analog delay line of claim 1, wherein a delay period of each of the digital delay elements is about 140 ps.

5. The analog delay line of claim 1, wherein a delay period of each of the digital delay elements is the same.

6. The analog delay line of claim 5, wherein the delay period of each of the digital delay elements is about 140 ps.

7. A method of delaying an analog signal, comprising the steps of:

converting the analog signal into a plurality of digital signals;

repeatedly delaying by a common delay period the plurality of digital signals of bit parallel format;

adjusting the common delay period in response to a digital calibration signal having a plurality of bits by switching on or off respective switchable inverters coupled in parallel in response to said bits; and converting the plurality of repeatedly delayed digital signals into a delay analog signal.

8. The method of claim 7, wherein the step of converting the analog signal into a plurality of digital signals includes the step of converting the analog signal into at least eight (8) digital signals.

9. The method of claim 7, wherein the step of converting the analog signal into a plurality of digital signals includes the step of converting the analog signal into at least sixteen (16) digital signals.

10. The method of claim 7, wherein the step of converting the analog signal into a plurality of digital signals includes the step of converting the analog signal into at least thirty-two (32) digital signals.

11. The method of claim 7, wherein the step of converting the analog signal into a plurality of digital signals includes the step of converting the analog signal into at least sixty-four (64) digital signals.

12. The method of claim 7, the step of adjusting includes the step of calibrating the common delay period to be about 140 ps.

13. A method of delaying an analog signal, comprising the steps of:

converting the analog signal into a plurality of digital signals;

repeatedly delaying by a common delay period the plurality of digital signals of bit parallel format through a digital delay line including a plurality of digital delay elements coupled in series, each of said digital delay elements including a respective adjustable inverter responsive to a digital calibration signal having a plurality of bits, and each said adjustable inverter including a plurality of switchable inverters coupled in parallel that are switched on or off in response to respective said bits of the digital calibration signal;

adjusting the common delay period in response to the digital calibration signal having a plurality of bits by switching on or off the switchable inverters coupled in parallel in response to said bits; and converting the plurality of repeatedly delayed digital signals into a delay analog signal.

\* \* \* \* \*